(12) United States Patent
Dong et al.

(10) Patent No.: US 9,465,242 B1
(45) Date of Patent: Oct. 11, 2016

(54) DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Zhifu Dong, Beijing (CN); Wei Xue, Beijing (CN); Ping Song, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY, CO., LTD., Hefei, Anhui (CN)

( * ) Notice: Subject to any disclaimer, the term of this patent is extended or adjusted under 35 U.S.C. 154(b) by 0 days.

(21) Appl. No.: 14/744,408

(22) Filed: Jun. 19, 2015

(30) Foreign Application Priority Data

Mar. 19, 2015 (CN) .......................... 2015 1 0124496

(51) Int. Cl.
*H01L 27/14* (2006.01)
*G02F 1/1333* (2006.01)
*H01L 27/12* (2006.01)
*G02F 1/1335* (2006.01)
*G02F 1/1362* (2006.01)
*G02F 1/1343* (2006.01)

(52) U.S. Cl.
CPC ... *G02F 1/133345* (2013.01); *G02F 1/133514* (2013.01); *G02F 1/134309* (2013.01); *G02F 1/136286* (2013.01); *H01L 27/124* (2013.01)

(58) Field of Classification Search
CPC .................................................... H01L 27/0924
USPC ......................................................... 257/72
See application file for complete search history.

(56) References Cited

U.S. PATENT DOCUMENTS

| 2014/0062920 A1* | 3/2014 | Lee ......................... G06F 3/041 345/173 |
| 2016/0018922 A1* | 1/2016 | Wang .................... G06F 3/0412 345/174 |

* cited by examiner

*Primary Examiner* — Anthony Ho
(74) *Attorney, Agent, or Firm* — Nath, Goldberg & Meyer; Joshua B. Goldberg; Christopher Thomas

(57) ABSTRACT

The present invention provides a display panel and a display device. The display panel comprises an array substrate and a color filter substrate assembled in an aligned manner, the array substrate comprises a display area and a lead wire area provided on the periphery of at least one side of the display area, a first boundary line of the color filter substrate close to one side of the lead wire area has an orthographic projection on the array substrate and the orthographic projection falls into a boundary area of the lead wire area adjacent to the display area, a protective layer is provided on one side of the boundary area facing the color filter substrate, and the protective layer covers parts of the boundary area corresponding to the orthographic projection of the first boundary line on the array substrate and lead wires surrounding the parts.

16 Claims, 1 Drawing Sheet

DISPLAY PANEL AND DISPLAY DEVICE

FIELD OF THE INVENTION

The present invention relates to the field of display technology, and particularly relates to a display panel and a display device.

BACKGROUND OF THE INVENTION

With the development of display technology, the liquid crystal display technology has been widely used and plays a vital role in industrial production and people's life.

As shown in FIG. 1, a liquid crystal display panel is generally formed by assembling an array substrate 1 and a color filter substrate 2 in an aligned manner. A lead wire area 12 is provided in the array substrate 1, and the lead wire area 12 needs to be exposed to connect with the input end of a peripheral circuit. Thus, a part of the color filter substrate 2 corresponding to the lead wire area 12 needs to be cut off, so that the lead wire area 12 in the array substrate 1 is exposed.

The cutting of the color filter substrate 2 is generally performed after the array substrate 1 and the color filter substrate 2 are aligned and assembled, and along the boundary of the lead wire area 12 and a non-lead wire area in the array substrate 1. When the color filter substrate 2 is cut by adopting cutting equipment, glass chippings are produced along a cutting line 3, meanwhile, the glass chippings are left in a region of the lead wire area 12 corresponding to the cutting line 3, so that lead wires 14 arranged in the region of the lead wire area 12 corresponding to the cutting line 3 are easily scratched. Serious scratch may even lead to poor contact of the lead wires 14 and finally lead to faults of the liquid crystal display panel.

SUMMARY OF THE INVENTION

Aiming at the above technical problems in the prior art, the present invention provides a display panel and a display device. The display panel is provided with a protective layer, so that glass chippings produced when a color filter substrate is cut along a first boundary line would not scratch parts of a boundary area in a lead wire area in an array substrate corresponding to the first boundary line of the color filter substrate and lead wires surrounding the parts, thus avoiding poor contact of the lead wires in the lead wire area, and further avoiding faults of the display panel and improving the yield of the display panel.

An embodiment of the present invention provides a display panel, including an array substrate and a color filter substrate which are assembled in an aligned manner, wherein the array substrate includes a display area and a lead wire area positioned on the periphery of at least one side of the display area, a first boundary line of the color filter substrate close to one side of the lead wire area has an orthographic projection on the array substrate and the orthographic projection falls into a boundary area of the lead wire area adjacent to the display area, a protective layer is provided on one side of the boundary area facing the color filter substrate, and the protective layer covers parts of the boundary area corresponding to the orthographic projection of the first boundary line on the array substrate and lead wires surrounding the parts.

A center line of the protective layer in width direction may correspond to the first boundary line, and the protective layer may have the same length as the first boundary line.

A width of the protective layer may range from 100 μm to 400 μm.

The protective layer may be made of organic insulating material or inorganic insulating material.

The lead wires may also extend to a center area of the lead wire area far away from the display area, and the protective layer does not cover the lead wires in the center area.

The array substrate may include a substrate as well as gate lines, a gate insulating layer, data lines, a passivation layer and common electrodes sequentially arranged on the substrate, and may further include a barrier layer arranged between the passivation layer and the data lines. The gate insulating layer and the passivation layer may also extend to the lead wire area, and the protective layer and the barrier layer may be made of the same material and arranged in the same layer level.

The sum of thicknesses of the protective layer and the passivation layer may range from 7,000 Å to 20,000 Å.

The lead wires may include the data lines and the gate lines extending to the lead wire area.

An embodiment of the present invention further provides a display device, including the above display panel.

The display panel provided by the embodiment of the present invention is provided with the protective layer covering the parts of the boundary area in the lead wire area in the array substrate corresponding to the first boundary line of the color filter substrate and the surrounding lead wires thereof. When the color filter substrate is cut along the first boundary line of the color filter substrate by adopting cutting equipment, glass chippings produced along the cutting line are left on the protective layer; and because of blocking protection of the protective layer, the glass chippings do not scratch the corresponding parts of the boundary area in the lead wire area and the surrounding lead wires thereof, thus avoiding poor contact of the lead wires in the lead wire area, then further avoiding faults of the display panel and improving the yield of the display panel.

The display device provided by the embodiment of the present invention adopts the above display panel, so that the yield of the display device is improved.

DETAILED DESCRIPTION OF THE EMBODIMENTS

To make those skilled in the art better understand the technical solutions of the present invention, a display panel and a display device provided by the present invention will be further described in detail below in combination with the accompanying drawings and specific embodiments.

Figure 1:
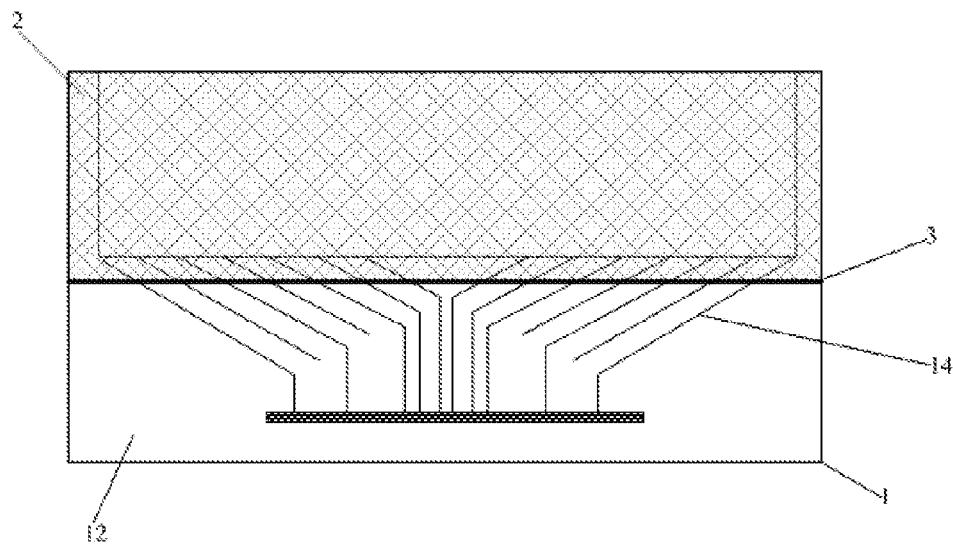
FIG. 1 is a structural top view of a display panel in the prior art.
Figure 2:
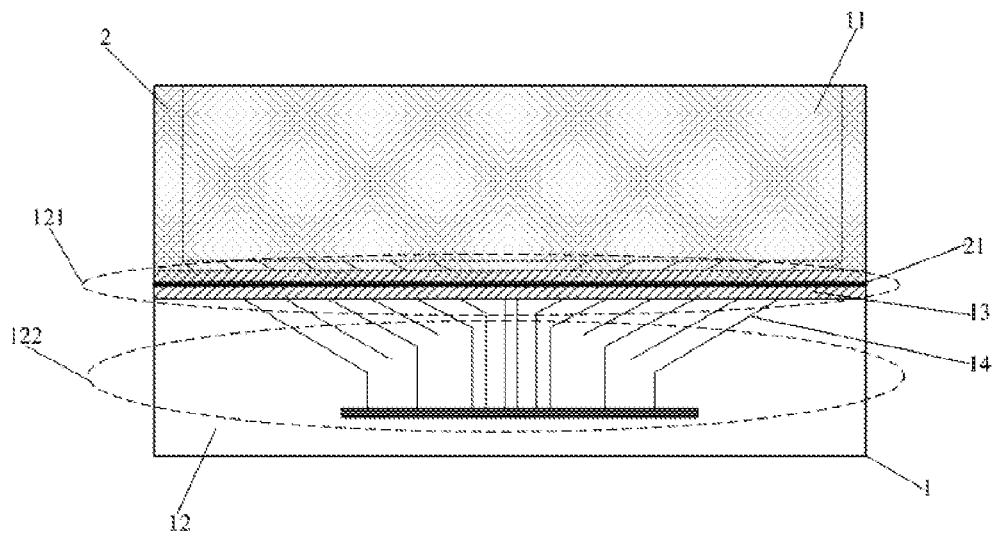
FIG. 2 is a structural top view of a display panel in an embodiment of the present invention.

As shown in FIG. 2, the embodiment of the present invention provides a display panel, including an array substrate 1 and a color filter substrate 2 which are assembled in an aligned manner. The array substrate 1 includes a display area 11 and a lead wire area 12 positioned on the periphery of at least one side of the display area 11. A first boundary line 21 of the color filter substrate 2 close to one side of the lead wire area 12 has an orthographic projection on the array substrate 1 and the orthographic projection falls into a boundary area 121 of the lead wire area 12 adjacent to the display area 11. A protective layer 13 is provided on one side, facing the color filter substrate 2, of the boundary area 121, and the protective layer 13 covers parts of the boundary area 121 corresponding to the orthographic projection of the first boundary line 21 (hereafter referred to as corresponding boundary parts) and lead wires 14 surrounding the corresponding boundary parts.

By providing the protective layer 13 which covers the corresponding boundary parts in the boundary area 121 and the surrounding lead wires 14, when the color filter substrate 2 is cut along the first boundary line 21 of the color filter substrate 2 by adopting cutting equipment, glass chippings produced along the cutting line are left on the protective layer 13. Because of blocking protection of the protective layer 13, the glass chippings do not scratch the corresponding boundary parts in the boundary area 121 of the lead wire area 12 and the surrounding lead wires 14 thereof, thus avoiding poor contact of the lead wires 14 in the lead wire area 12, then further avoiding faults of the display panel and improving the yield of the display panel.

In this embodiment, a center line of the protective layer 13 in width direction corresponds to the first boundary line 21, and the protective layer 13 has the same length as the first boundary line 21. The first boundary line 21 is positioned above the width center line of the protective layer 13. When the first boundary line 21 is cut, glass chippings are produced on both sides of the first boundary line 21 and are substantially identical in quantity on the both sides. Meanwhile, the glass chippings are concentrated on the both sides of the first boundary line 21 after the cutting, as such, the protective layer 13 is configured to cover and protect the corresponding boundary parts and the lead wire area 12 on both sides thereof, thus preventing the glass chippings produced when the first boundary line 21 is cut from scratching the corresponding boundary parts and the lead wires 14 on both sides thereof in the lead wire area 12.

In this embodiment, a width of the protective layer 13 ranges from 100 μm to 400 μm. The protective layer 13 is wide enough to block the glass chippings produced when the first boundary line 21 is cut, so that the glass chippings do not scratch the corresponding boundary parts and the lead wires 14 on both sides thereof in the lead wire area 12. Meanwhile, the protective layer 13 with such a width does not produce any influence on the connection between the lead wire area 12 and a peripheral circuit, namely the protective layer 13 in the width range can ensure well connection between the lead wire area 12 and the peripheral circuit.

It should be noted that, the width range of the protective layer 13 is actually determined by the cutting precision of the cutting equipment. If the cutting precision of the cutting equipment is high, the width of the protective layer 13 may be small. If the cutting precision of the cutting equipment is low, the width of the protective layer 13 must be large. The width of the protective layer 13 should not only ensure that the glass chippings produced during cutting do not scratch the corresponding boundary parts and the lead wires 14 on both sides thereof in the lead wire area 12, but also ensure the well connection between the lead wire area 12 and the peripheral circuit.

In this embodiment, the protective layer 13 is made of organic insulating material or inorganic insulating material. The protective layer 13 may also be made of other insulating material, as long as the protective layer 13 can achieve a certain blocking effect on the glass chippings.

In this embodiment, the lead wires 14 also extend to a center area 122 of the lead wire area 12 far away from the display area 11, and the protective layer 13 does not cover the lead wires 14 in the center area 122, thus ensuring well connection between the lead wires 14 in the center area 122 of the lead wire area 12 and the peripheral circuit. If the protective layer 13 extends to the center area 122 of the lead wire area 12, the protective layer 13 with a certain thickness may influence well connection between the lead wires 14 in the center area 122 of the lead wire area 12 and the peripheral circuit.

In this embodiment, the array substrate 1 includes a substrate as well as gate lines, a gate insulating layer, data lines, a passivation layer and common electrodes which are sequentially arranged on the substrate, and further includes a barrier layer arranged between the passivation layer and the data lines. The gate insulating layer and the passivation layer also extend to the lead wire area 12, and the protective layer 13 and the barrier layer are made of the same material and arranged in the same layer level. The barrier layer may reduce the parasitic capacitance between the data lines and the common electrodes, which is favorable for normal display of the display panel. The protective layer 13 and the barrier layer are manufactured in the same patterning process, so that the manufacturing of the protective layer 13 would not increase the patterning process steps in the manufacturing of the array substrate.

In this embodiment, the lead wires 14 include data lines and gate lines extending to the lead wire area 12. When the lead wires 14 are data lines, a passivation layer and a protective layer 13 which serve as two insulating layers are provided above the corresponding boundary parts of the lead wire area 12 and the data lines on both sides thereof, and compared with the situation that only a passivation layer is provided above the corresponding boundary parts of the lead wire area 12 and the data lines on both sides thereof, the protective layer 13 enhances the protection on the corresponding boundary parts of the lead wire area 12 and the data lines on both sides thereof, so that glass chippings produced when the first boundary line 21 is formed by cutting are unlikely to scratch the corresponding boundary parts of the lead wire area 12 and the data lines on both sides thereof. Similarly, when the lead wires 14 are gate lines, a gate insulating layer, a protective layer 13 and a passivation layer which serve as three insulating layers are provided above the corresponding boundary parts of the lead wire area 12 and the gate lines on both sides thereof, and compared with the situation that only a gate insulating layer and a passivation layer are provided above the corresponding boundary parts of the lead wire area 12 and the gate lines on both sides thereof, the protective layer 13 enhances the protection on the corresponding boundary parts of the lead wire area 12 and the gate lines on both sides thereof, so that glass chippings produced when the first boundary line 21 is formed by cutting are unlikely to scratch the corresponding boundary parts of the lead wire area 12 and the gate lines on both sides thereof. Therefore, the corresponding boundary parts of the lead wire area 12 as well as the data lines and the gate lines on both sides of the corresponding boundary parts may not be scratched, and then the yield of the display panel is ensured.

In this embodiment, the sum of thicknesses of the protective layer 13 and the passivation layer is 7,000 Å to 20,000 Å. According to experimental data, when the thickness of the insulating layers provided on the lead wire area 12 and covering the corresponding boundary parts and the lead wires 14 on both sides thereof is more than or equal to 7,000 Å, the lead wires 14 in this area would not be scratched by the glass chippings produced when the color filter substrate is cut. Therefore, the sum of thicknesses of the protective layer 13 and the passivation layer is sufficient to protect the lead wires 14 (such as data lines and gate lines) from being scratched, thus ensuring the yield of the display panel.

The display panel provided by this embodiment is provided with the protective layer covering the parts (that is, the corresponding boundary parts) of the boundary area in the lead wire area of the array substrate corresponding to the first boundary line of the color filter substrate and the surrounding lead wires thereof. When the color filter substrate is cut along the first boundary line of the color filter substrate by adopting cutting equipment, the glass chippings produced along the cutting line are left on the protective layer, and because of blocking protection of the protective layer, the glass chippings do not scratch the corresponding boundary parts arranged in the boundary area of the lead wire area and the surrounding lead wires thereof, thus avoiding poor contact of the lead wires in the lead wire area, then further avoiding faults of the display panel and improving the yield of the display panel.

The embodiments of the present invention further provide a display device, including the aforementioned display panel.

The yield of the display device is improved by adopting the aforementioned display panel.

It could be understood that, the above embodiments are merely exemplary embodiments adopted for describing the principle of the present invention, rather than limiting the present invention. Various modifications and improvements may be made for those of ordinary skill in the art without departing from the spirit and essence of the present invention, and these modifications and improvements are regarded as within the protection scope of the present invention.

The invention claimed is:

1. A display panel, comprising an array substrate and a color filter substrate which are assembled in an aligned manner, wherein
   the array substrate comprises a display area and a lead wire area provided on the periphery of at least one side of the display area,
   a first boundary line of the color filter substrate close to one side of the lead wire area has an orthographic projection on the array substrate and the orthographic projection falls into a boundary area of the lead wire area adjacent to the display area, and
   a protective layer is provided on one side of the boundary area facing the color filter substrate, and the protective layer covers parts of the boundary area corresponding to the orthographic projection of the first boundary line on the array substrate and lead wires surrounding the parts of the boundary area.

2. The display panel of claim 1, wherein a center line of the protective layer in width direction corresponds to the first boundary line, and the protective layer has the same length as the first boundary line.

3. The display panel of claim 2, wherein a width of the protective layer ranges from 100 μm. to 400 μm.

4. The display panel of claim 1, wherein the protective layer is made of organic insulating material or inorganic insulating material.

5. The display panel of claim 1, wherein the lead wires also extend to a center area of the lead wire area far away from the display area, and the protective layer does not cover the lead wires in the center area.

6. The display panel of claim 1, wherein the array substrate comprises a substrate as well as gate lines, a gate insulating layer, data lines, a passivation layer and common electrodes sequentially arranged on the substrate, and the array substrate further comprises a barrier layer arranged between the passivation layer and the data lines;
   the gate insulating layer and the passivation layer also extend to the lead wire area, and the protective layer and the barrier layer are made of the same material and arranged in the same layer level.

7. The display panel of claim 6, wherein the sum of thicknesses of the protective layer and the passivation layer ranges from 7,000 Å to 20,000 Å.

8. The display panel of claim 6, wherein the lead wires comprise the data lines and the gate lines extending to the lead wire area.

9. A display device, comprising a display panel which comprises an array substrate and a color filter substrate assembled in an aligned manner, wherein
   the array substrate comprises a display area and a lead wire area provided on the periphery of at least one side of the display area,
   a first boundary line of the color filter substrate close to one side of the lead wire area has an orthographic projection on the array substrate and the orthographic projection falls into a boundary area of the lead wire area adjacent to the display area, and
   a protective layer is provided on one side of the boundary area facing the color filter substrate, and the protective layer covers parts of the boundary area corresponding to the orthographic projection of the first boundary line on the array substrate and lead wires surrounding the parts of the boundary area.

10. The display device of claim 9, wherein a center line of the protective layer in width direction corresponds to the first boundary line, and the protective layer has the same length as the first boundary line.

11. The display device of claim 10, wherein a width of the protective layer ranges from 100 μm to 400 μm.

12. The display device of claim 9, wherein the protective layer is made of organic insulating material or inorganic insulating material.

13. The display device of claim 9, wherein the lead wires also extend to a center area of the lead wire area far away from the display area, and the protective layer does not cover the lead wires in the center area.

14. The display device of claim 9, wherein the array substrate comprises a substrate as well as gate lines, a gate insulating layer, data lines, a passivation layer and common electrodes sequentially arranged on the substrate, and the array substrate further comprises a barrier layer arranged between the passivation layer and the data lines;
   the gate insulating layer and the passivation layer also extend to the lead wire area, and the protective layer and the barrier layer are made of the same material and arranged in the same layer level.

15. The display device of claim 14, wherein the sum of thicknesses of the protective layer and the passivation layer ranges from 7,000 Å to 20,000 Å.

16. The display device of claim 14, wherein the lead wires comprise the data lines and the gate lines extending to the lead wire area.

* * * * *